United States Patent [19]

Bhattacharyya et al.

[11] 4,190,466
[45] Feb. 26, 1980

[54] METHOD FOR MAKING A BIPOLAR TRANSISTOR STRUCTURE UTILIZING SELF-PASSIVATING DIFFUSION SOURCES

[75] Inventors: Arup Bhattacharyya, Essex Center; Francis W. Wiedman, III, Stowe, both of Vt.

[73] Assignee: International Business Machines Corporation, Armonk, N.Y.

[21] Appl. No.: 863,182

[22] Filed: Dec. 22, 1977

[51] Int. Cl.$^2$ ............... H01L 21/265; H01L 21/225; H01L 21/31
[52] U.S. Cl. ............................... 148/1.5; 29/578; 29/590; 29/591; 148/187; 148/188; 148/190; 148/174; 156/653; 156/657; 156/662; 357/34; 357/36; 357/45; 357/50; 357/51; 357/59; 357/91; 427/86
[58] Field of Search .............. 148/1.5, 187, 174, 188, 148/190; 29/576 B, 578, 590, 591; 357/34, 36, 45, 50, 51, 59, 91; 427/85, 86; 156/653, 657, 662; 307/238

[56] References Cited

U.S. PATENT DOCUMENTS

| | | | |
|---|---|---|---|
| 3,574,010 | 4/1971 | Brown | 148/188 X |
| 3,739,237 | 6/1973 | Shannon | 357/91 X |
| 3,843,425 | 10/1974 | Katnack | 148/188 X |
| 3,904,450 | 9/1975 | Evans et al. | 148/174 X |
| 4,031,608 | 6/1977 | Togei et al. | 29/578 |
| 4,055,444 | 10/1977 | Rao | 148/1.5 |
| 4,063,967 | 12/1977 | Graul et al. | 148/174 X |
| 4,074,304 | 2/1978 | Shiba | 357/59 |
| 4,085,499 | 4/1978 | Kuninobu et al. | 357/59 X |
| 4,111,720 | 9/1978 | Michel et al. | 148/1.5 |
| 4,128,845 | 12/1978 | Sakai | 357/51 |

Primary Examiner—L. Dewayne Rutledge
Assistant Examiner—W. G. Saba
Attorney, Agent, or Firm—Stephen J. Limanek

[57] ABSTRACT

A semiconductor structure, formed within a recessed oxide isolation region, includes a semiconductor substrate of a first conductivity type within which a collector of opposite conductivity type is formed below the surface of the substrate and extending in part to the surface of the substrate for ease of contact. A first layer of doped polycrystalline silicon or polysilicon is formed on a first portion of the surface of the substrate and in electrical contact with the substrate which acts as the base of a transistor. The first polysilicon layer is oxidized to form an outer insulating layer thereover. A second doped polysilicon layer is disposed over the outer insulating layer onto a second portion of the surface of the substrate so as to be spaced from the first portion by only the thickness of the outer insulating layer on the first polysilicon layer. The dopant in the second polysilicon layer is driven into the surface of the semiconductor substrate to form an emitter therein. Means, which may include a portion of the second polysilicon layer, are provided for electrically contacting the collector to thus form a completed compact bipolar transistor which has very high performance.

28 Claims, 12 Drawing Figures

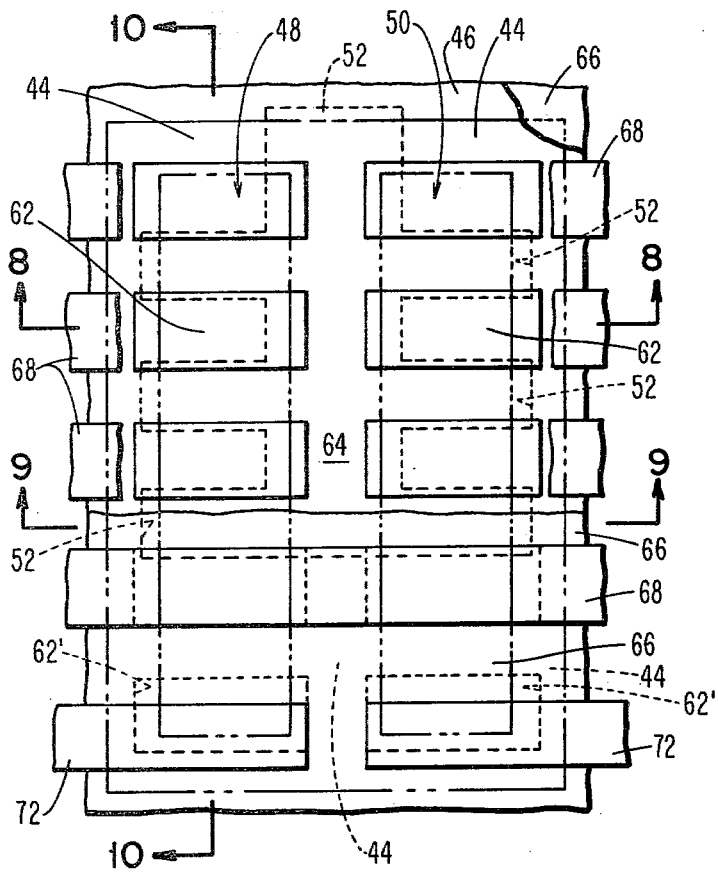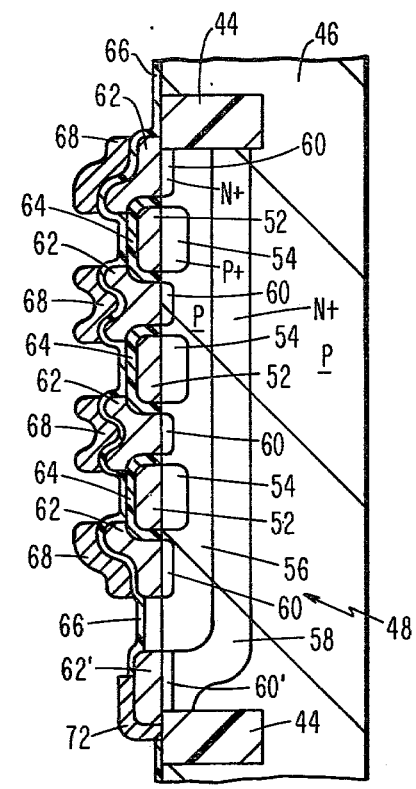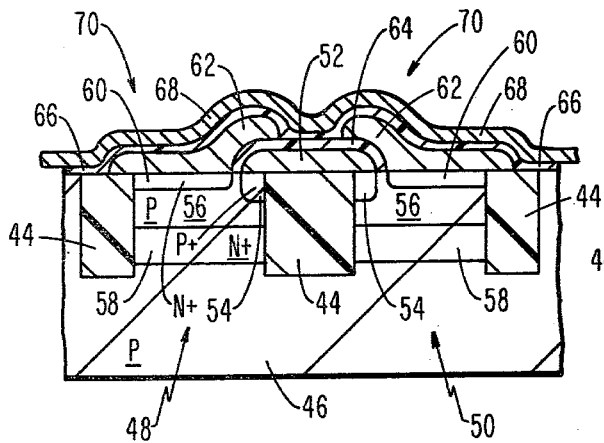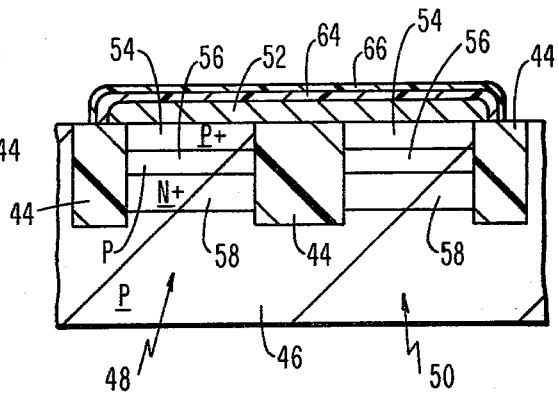
FIG. 7
FIG. 10
FIG. 8
FIG. 9

METHOD FOR MAKING A BIPOLAR TRANSISTOR STRUCTURE UTILIZING SELF-PASSIVATING DIFFUSION SOURCES

BACKGROUND OF THE INVENTION

1. Field of the Invention

This invention relates to integrated semiconductor structures and circuits and more particularly to memory structures and circuits which employ a capacitor for storing binary digits of information.

2. Description of the Prior Art

Integrated semiconductor memory circuits, particularly those employing cells which include essentially a storage capacitor and a switch, have achieved high memory cell densities. One of the simplest circuits for providing small memory cells is described in commonly assigned U.S. Pat. No. 3,387,286, filed July 14, 1967, by R. H. Dennard. Each of these cells employs a storage capacitor and a field effect transistor acting as a switch to selectively connect the capacitor to a bit sense line. In also commonly assigned U.S. Pat. Nos. 3,811,076, by W. M. Smith, and 3,841,926, by R. H. Garnache and W. M. Smith, both filed Jan. 2, 1973, there is disclosed a one device field effect transistor memory cell of the type described in the above-identified Dennard patent which is made to a small size by utilizing a layer of doped polycrystalline silicon separated by a dielectric medium disposed on the surface of a semiconductor substrate for forming a storage capacitor.

In another commonly assigned U.S. Pat. No. 3,979,734, filed on June 16, 1975, by W. D. Pricer and J. E. Selleck, there is described a memory array made of small cells which employ storage capacitors and bipolar transistors. In this latter array, which is word organized, each storage capacitor of these cells has simply one capacitor terminal connected to a separate bit sense line while selected cells forming a word are simultaneously accessed by utilizing a word pulse for coupling to the other terminal of the storage capacitors of that word. By simultaneously accessing the other terminal of all storage capacitors of a particular word, isolation between cells of the word is not required. This bipolar transistor memory array has a high performance since bipolar transistors used therein inherently operate faster than do field effect transistors. Many known bipolar transistors, for example, of the type disclosed in U.S. Pat. No. 3,904,450, made by diffusing impurities from polysilicon into a semiconductor substrate may be used to provide a bipolar memory array with a satisfactory performance, however, in order to provide higher performance memory arrays very high performance transistors are required.

SUMMARY OF THE INVENTION

It is an object of this invention to provide a transistor structure which is small in size and high in performance while operative either in conventional downward mode or in upward mode, that is, the physical collector acting as an electrical emitter.

It is another object of this invention to provide an improved transistor structure wherein the base and emitter have a minimum spacing with self-aligned contacts.

It is still another object of this invention to provide an improved memory array wherein both density and performance enhancement are achieved.

Yet a further object of this invention is to provide an improved memory having higher density and reduced access time in the array.

A further object of this invention is to provide an improved memory array wherein the word line pitch is reduced and the propagation delay or skew is eliminated.

Still another object of this invention is to provide an improved memory array with a process requiring fewer masks.

A still further object of this invention is to provide an improved bipolar transistor memory array which does not require an epitaxial layer and which can be produced by utilizing ion implantation techniques.

Yet another object of this invention is to achieve a high performance memory array using very low power.

In accordance with the teachings of this invention, a semiconductor structure, formed within a recessed oxide isolation region, includes a semiconductor substrate of a first conductivity type within which a collector of opposite conductivity type is formed, preferably by ion implantation techniques, below the surface of the substrate. A first conductive layer, preferably of boron doped polycrystalline silicon or polysilicon, is formed on a first portion of the surface of the substrate and in electrical contact with the substrate which acts as the base of a transistor. The first polysilicon layer is oxidized to form an outer insulating layer on the polysilicon layer and a second doped polysilicon layer is disposed over the outer insulating layer and onto a second portion of the surface of the substrate so as to be spaced from the first portion by only the thickness of the outer insulating layer on the first polysilicon layer. The dopant, which for example may be arsenic, in the second polysilicon layer is driven into the surface of the semiconductor substrate to form an emitter therein. Means are provided for electrically contacting the collector buried in the substrate to thus form a completed compact bipolar transistor which has very high performance. The process and structure thus outlined yields simultaneously very low or small junction capacitances, base and collector resistances and electrical base width, and overall very small volume, thereby satisfying all requirements of extremely high performance at reduced power.

In accordance with another aspect of this invention, it has been found that this bipolar transistor structure can be used very effectively to form a compact high performance memory system. In this memory system, which may be in a 2½ dimensional arrangement, the bases of each of the bipolar transistors are connected in common as are the collectors of each of these transistors, each being disposed within the recessed oxide isolation region. Also disposed within the isolation region are a plurality of emitters each forming a separate transistor with the common base and common collector. Each emitter is formed with respect to the base contact in the manner described hereinabove. Accordingly, the spacing between each emitter and its base is very short. The polysilicon layer contacting each emitter can be utilized as one plate of a storage capacitor. By providing a dielectric medium on this polysilicon layer and then depositing a conductive layer over the dielectric medium, a storage capacitor is formed which can be accessed through the bipolar transistor, with the plurality of emitters arranged to form a plurality of bits or a word of a very dense memory array capable of being operated at high speeds.

By forming a second recessed oxide isolation region within which is formed another similar bipolar transistor array, the base contacts of both arrays may be connected by a common word line, preferably in the form of the first conductive polysilicon layer, to further increase the density of the memory. When a continuous and common base contact connection, to which is coupled the word line of the memory, is used for first and second adjacent plurality of bits or words, a line selection technique is employed to inhibit one of the first and second plurality of bits or words. In this arrangement only one word driver is required for every two words of the memory, thereby further reducing power requirements to energize the memory array and at the same time requiring fewer electrical peripheral or support circuits.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIG. 7 is a plan view of the memory of the present invention illustrating two memory words each recessed in a separate isolation region, FIG. 8 is a sectional view of the memory of FIG. 7 taken through lines 8—8, FIG. 9 is a sectional view of the memory of FIG. 7 taken through line 9—9, FIG. 10 is a sectional view of the embodiment of the memory of FIG. 7 taken through line 10—10.

Figure 1:
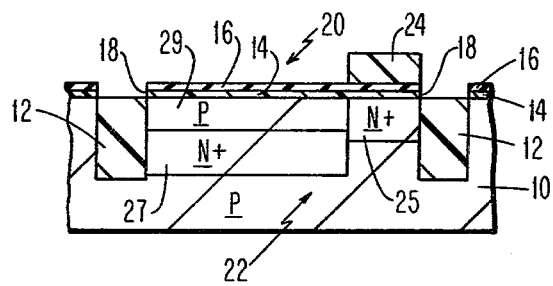
FIGS. 1–5 are sectional views of an embodiment of the bipolar transistor structure indicating various steps in the process of the invention as the structure is being made.
Figure 2:
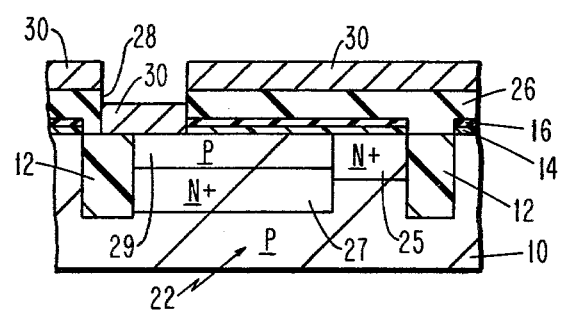
Figure 3:
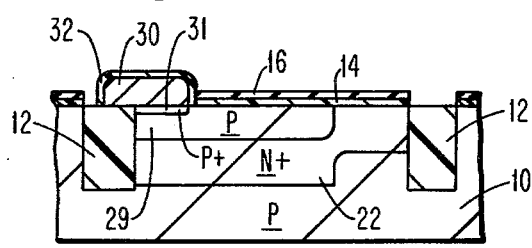
Figure 4:
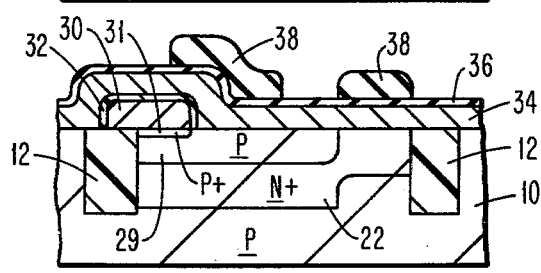
Figure 5:
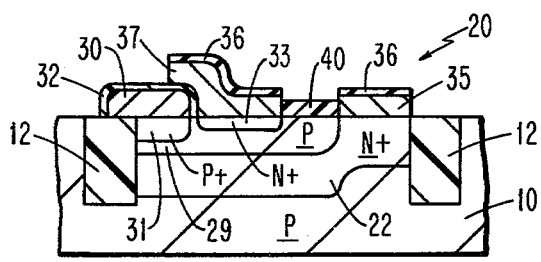
Figure 6:
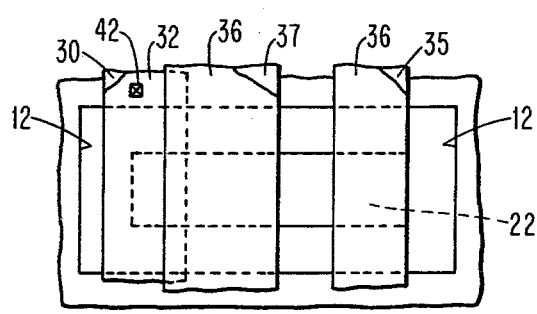
FIG. 6 is a plan view of the embodiment of the transistor structure illustrated in FIGS. 1–5.

DESCRIPTION OF THE PREFERRED EMBODIMENTS:

Referring to FIGS. 1–5 in more detail there is illustrated sectional views of an embodiment of the transistor structure made by the present invention. As shown in FIG. 1, a semiconductor substrate 10, preferably made of low doped P-type silicon, has an isolation or recessed oxide region 12 defining a portion of the substrate 10, as is seen more clearly in the plan view of FIG. 6 of the drawing. Grown on the surface of the substrate 10 is a silicon dioxide layer 14 over which there is deposited a silicon nitride layer 16. An opening 18 is formed within the oxide layer 14 and the nitride layer 16 for defining the recessed oxide region 12. After the opening 18 is formed in oxide and nitride layers 14 and 16, by known techniques, the substrate 10 within the opening 18 is etched by, e.g., known reactive ion etching techniques, and then oxidized to form the recessed oxide isolation region 12. To form a transistor 20 within the isolation region 12 a collector 22 is formed beneath the surface of the substrate 10 by using ion implantation techniques. In accordance with the process of this invention, the buried collector 22 is formed by first applying a layer of photoresist 24 over the silicon nitride layer 16 and then by known masking techniques removing all of the photoresist 24 except that portion indicated in FIG. 1 of the drawing. The thickness of the photoresist 24 is such that ions, e.g., phosphorus, implanted into the substrate 10 through the photoresist 24 are distributed within the substrate 10 from the surface of the substrate 10 to a depth below the shallowest penetration of the ions which pass only through the oxide layer 14 and the nitride layer 16 within the isolation region 12, as indicated in subregion 25. The main portion of the buried collector 22 is indicated by subregion 27. The P-region in substrate 10 located between the subregion 27 and silicon dioxide layer 14 is formed to provide a base 29 of the transistor structure. After the collector 22 has been formed in the substrate 10, the remaining portion of the photoresist 24 is stripped from the surface of the silicon nitride 16 and a second layer 26 of photoresist is blanket deposited over the entire surface of the structure. By using conventional masking techniques a portion of the photoresist 26 is removed to form an opening 28 to the surface of the substrate 10. A layer of self-oxidizable material, such as a first layer of boron doped polysilicon 30, is then deposited over the photoresist layer 26 and through the opening 28 onto the surface of the substrate 10 to a thickness of approximately 6000 Å, as illustrated in FIG. 2. The photoresist is then removed by known techniques which also removes all of the first polysilicon layer 30 except for that portion which does not overlie the photoresist 26. By utilizing a well known wet-dry-wet oxidation process, the surface of the first polysilicon layer 30 is oxidized to form the first polysilicon oxide layer 32, as shown in FIG. 3 of the drawing. During the oxidation step the boron in the polysilicon layer 30 is driven into the base 29 to make a contact 31 therewith. After removing the oxide and nitride layer, 14 and 16, shown in FIG. 3, a second layer of self-oxidizable material, which is preferably a second polysilicon layer 34, is deposited over the surface of the structure, as indicated in FIG. 4 of the drawing. The second polysilicon layer may be doped with arsenic, i.e., an N-type impurity, and may also have a thickness of approximately 6000 Å. Over the second polysilicon layer 34 is deposited another layer of silicon nitride 36 which in turn is covered by a photoresist layer 38. Again by using known masking techniques all of the photoresist layer 38 is removed except for a segment of photoresist layer 38 disposed over the subregion 25 of the buried collector 22 which extends to the surface of the substrate 10 and a spaced apart segment of the photoresist layer 38 which is disposed over a portion of the first polysilicon layer 30 and an adjacent portion of the subregion 27 of the subcollector 22, as illustrated in FIG. 4 of the drawing. The exposed portions of the silicon nitride layer 36 and then removed by using a well known dry or wet etching technique and the segments of the second polysilicon layer 34 under the exposed nitride layer 36 are removed by use of well known etches, such as either a wet chemical solution of nitric/acetic or a dry plasma etch. After the second polysilicon layer 34 has been etched, only the segment 37 of the second polysilicon layer overlying the first layer of polysilicon 30 and in contact with the surface of the substrate 10 remains, along with segment 35 in contact with collector 22, as shown in FIG. 5. The photoresist layer 38 is then stripped from the structure and the exposed surface of the substrate 10 between the segments 35 and 37 of the second layer of polysilicon is oxidized to form insulation layer 40. Also, the arsenic is slightly driven into the base 29 to form a shallow emitter 33 in a closely spaced relationship to base contact 31. This spacing is within the thickness of the first polysilicon oxide layer 32. To complete the transistor structure 20, a contact hole or opening may be formed in the first layer of polysilicon oxide layer 32 to provide a contact 42 to the first layer of polysilicon 30, as indicated in the plan view of the structure shown in FIG. 6 of the drawing. As desired, appropriate metallization may then be applied to segments 35, 37 and contact 42 for any suitable interconnection needs after removing all or a portion of the nitride layer 36 indicated in FIG. 5.

It should be noted that by using the process of this invention the emitter defined by the segment 37 of the second layer of polysilicon is spaced very close, within the thickness of the first polysilicon oxide layer 32, to the base contact defined by the first layer of polysilicon 30. This arrangement provides low base resistance and consequently a very high speed bipolar transistor. Furthermore, by arranging the collector 22 so as to abutt the recessed isolation region 12 a further advantage is provided in that high collector-base junction breakdown voltage and low junction capacitance is achieved.

It should be further noted that subregions 25 and 27 of collector 22 gradually change their shape due to process heating steps to form the final shape of the collector 22 as shown in FIG. 5. A continuous collector thus achieved results in low collector resistance.

It should also be noted that modifications to the process of this invention may be made without departing from the spirit and scope of the invention. For example, the nitride layer 36 indicated in FIGS. 4 and 5 could be replaced by a second polysilicon oxide layer over segments 35 and 37 since contact openings could be made through any oxide formed on segments 35 and 37. Furthermore, the collector 22 need not be arranged so as to extend to the surface of the substrate 10 since other means for contacting the collector may be utilized in certain instances. Additionally, either or both polysilicon layers can be replaced by metal silicides, for example, molybdenum silicide, tungsten silicide or others and in certain instances self-oxidizable metals, e.g., aluminum, tantulum, niobium and zirconium.

In FIGS. 7 there is illustrated a plan view of a memory, which utilizes the bipolar transistor structure arrangements shown in FIGS. 1 to 6, having a high density of cells which operate at high speeds. FIGS. 8, 9 and 10 are sectional views of the memory of FIG. 7 taken through lines 8—8, 9—9 and 10—10, respectively. As indicated in FIGS. 7 to 10, a recessed oxide isolation region 44 is made in the substrate 46, which is preferably low-doped P-type silicon, to form two adjacent isolated substrate segments 48 and 50 at the upper portion of the substrate 46.

By employing the techniques described in connection with the making of the bipolar transistor structure illustrated in FIGS. 1 to 6, a first boron doped polysilicon layer 52 is formed to provide a contact at 54 to the base 56 of each of the transistors formed within the substrate segments 48 and 50 after buried collector 58 has been formed in each of the isolated substrate segments 48 and 50 in the manner described in connection with the transistor structure of FIGS. 1-6. Emitters 60 are made by driving arsenic dopant from the second polysilicon layer 62 into the substrate segments 48 and 50, as taught hereinabove and as indicated more clearly in FIGS. 8 and 10. A first polysilicon oxide layer 64 separates the first polysilicon layer 52 from the second polysilicon layer 62. It should be noted that the buried collector 58 is a common collector and the base 56 is a common base associated with each of the emitters 60 of one of the substrate segments 48 and 50, as shown more clearly in FIG. 10 of the drawings. Disposed over the second polysilicon layer 62 is a dielectric medium which is preferably a layer of silicon nitride 66, shown partially broken away in FIG. 7, and a metallic layer, e.g., copper doped aluminum, is deposited over the silicon nitride layer 66 and suitably etched to form bit/sense lines 68, the upper three lines 68 in FIG. 7 being partially broken away. It can be seen, particularly in FIG. 8, that the second layer of polysilicon 62, the silicon nitride layer 66 and the bit/sense line 68 form a storage capacitor 70 at each of the emitters 60. It should be noted, particularly in FIG. 9, that the first polysilicon layer 52 contacts a substantial portion of the base 56 so as to minimize or eliminate skew when the word line of the memory is connected to the first polysilicon layer 52.

In order to provide a connection to each of the buried collectors 58, the arsenic in the segment 62' of the second polysilicon layer 62 is driven into the N+ collector 58 to form contact 60' when emitters 60 are being formed in the base 56. An ohmic or metallic contact is made to each of the segments 62' by etching away the silicon nitride over the segment 62' prior to the deposition of the copper doped aluminum and then appropriately masking to form the metal contacts 72 at the time that the bit/sense lines 68 are being formed.

Figure 11:
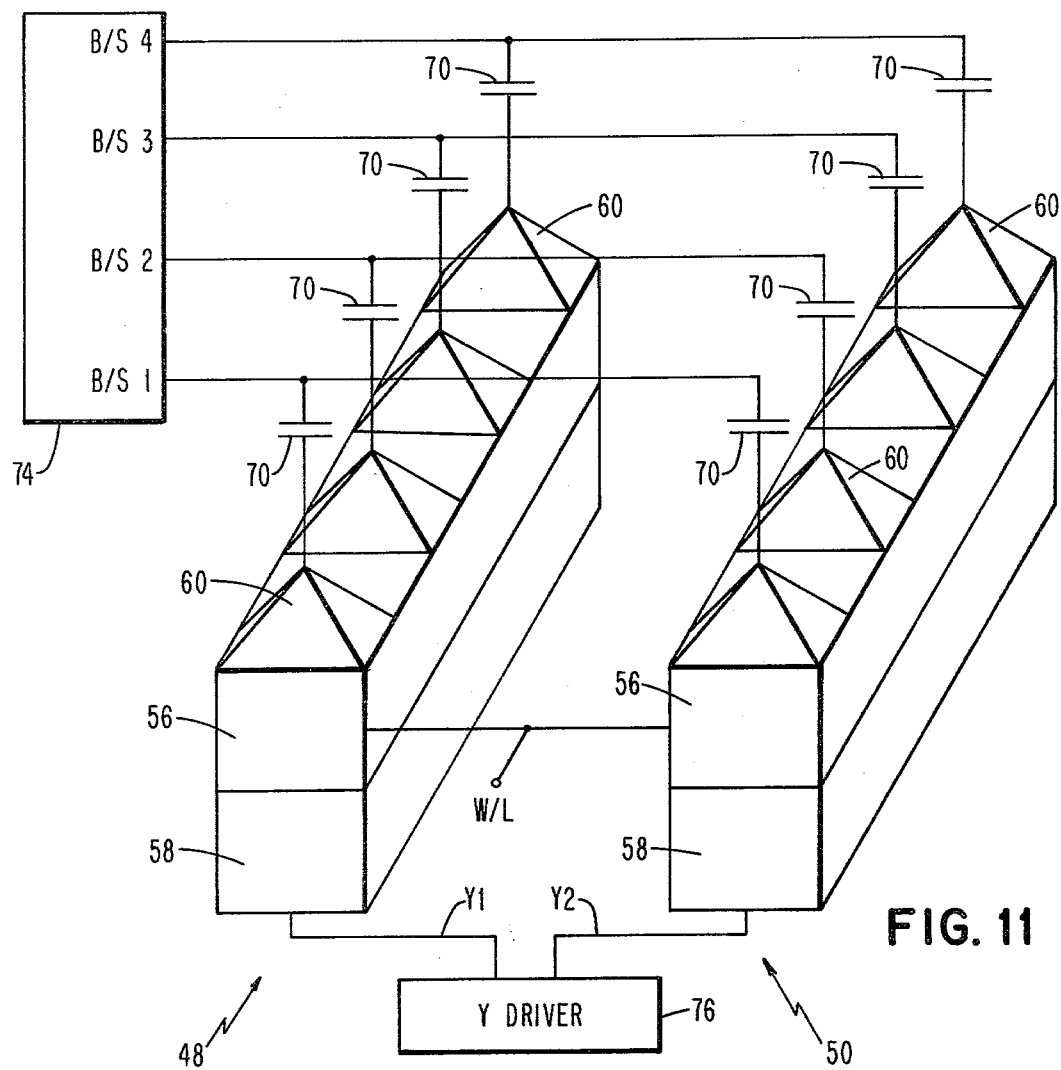
FIG. 11 illustrates a circuit which may be used for operating two adjacent words of the memory of the present invention.
Figure 12:
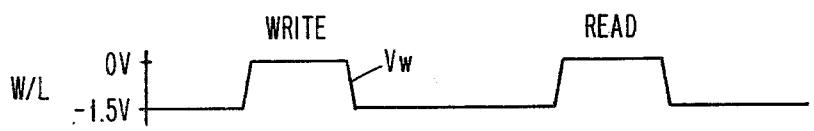
FIG. 12 is a pulse program which may be used to operate the memory illustrated in FIG. 11.
Figure 12:
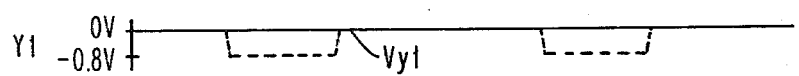
Figure 12:
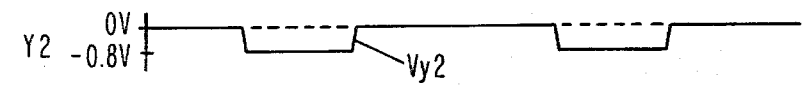
Figure 12:
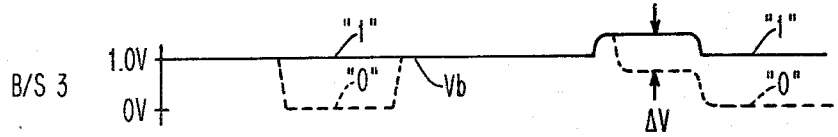

In order to better understand the operation of the memory illustrated in FIGS. 7-10, a simplified sketch of the memory has been shown in FIG. 11 wherein similar elements of the memory have the same reference numbers as those found in FIGS. 7-10. The memory in FIG. 11 also indicates the drive, sense and selection circuits used to operate the memory. The memory, made in a 2½ dimensional organization, includes the substrate segments 48 and 50, each of which has four storage capacitors 70 for storing four bits of information in four memory cells. Of course each of the substrate segments 48 and 50 may have many more than four bits, the four bits being used only for illustrative purposes. In FIG. 12 the pulse program which may be used for this memory is illustrated.

To write information representing a "1" into one of the four storage capacitors 70, associated with the substrate segment 50, e.g., into capacitor 70 connected to bit/sense line B/S3 coupled to bit driver-sense amplifier 74, a positive-going voltage pulse Vw is applied to the word line W/L, a negative-going pulse Vy2 is applied to select line Y2 from Y driver 76 and a constant voltage of +Vb is maintained on bit/sense line B/S3, storing charge on capacitor 70 connected to B/S3. In order to inhibit the memory cells associated with substrate segment 48, Y1 is maintained at ground potential, keeping the base-collector junction of segment 48 under reverse bias. To write a "0" into the storage capacitor 70 connected to bit/sense line B/S3, bit/sense line B/S3 is pulled down to zero volts with the other lines W/L, Y1 and Y2 having the same voltage magnitudes. To read information from the storage capacitor 70 connected to bit/sense line B/S3, the positive-going voltage pulse Vw is again applied to the word line W/L and a negative-going pulse Vy2 is applied to select line Y2 while the voltage at Y1 is maintained at ground potential, as indicated in FIG. 12 of the drawing. When a "1" bit of information has been stored in the capacitor 70 the voltage on bit/sense line B/S3 will rise and when a "0" bit of information has been stored therein the voltage on bit/sense line B/S3 will fall, as indicated in FIG. 12 at B/S3. The difference in voltage ΔV can be readily detected by sense amplifier 74 to identify "1" and "0" bits of information stored in the storage capacitor 70. To write into or to read out of other storage capacitors 70 of the substrate segment 50, appropriate bit/sense lines B/S1, B/S2 or B/S4 are selected while similar voltages are applied to W/L and Y2.

In order to write into or read out of the storage capacitors 70 associated with substrate segment 48, similar voltages and lines are selected except that substrate segment 50 is inhibited by maintaining zero voltage to select line Y2 while select line Y1 has applied thereto the negative-going voltage Vy1. Typical drive voltage ranges for Vw, Vy1, Vy2 and Vb are −1.5 to 0, −0.8 to 0, −0.8 to 0 and 0 to +1 volts, respectively.

Although only a first and a second plurality of bits or words have been illustrated as defined by isolated substrate segments 48 and 50, additional bits or words can be provided with the select line Y1 connected to the collector of one half of all the bits or words and the select line Y2 connected to the collector of the other half of the bits or words.

It can be seen that this invention provides a memory which is very dense and which operates at high speeds.

As mentioned hereinabove with respect to the processing of the transistor structure of FIGS. 1-6, although polysilicon layers which are self-passivating or self-oxidizing have been used, other self-passivating material such as self-anodizable metals aluminum, tantalum, zirconium or niobium, as well as the metal silicides, may also be used, if desired. Also, if desired, the first polysilicon layer may be doped with impurities other than boron as long as they are of the P-type and the second polysilicon layer may be doped with phosphorus instead of arsenic or any dopant that is N-type. Of course, if an N-type semiconductor substrate is used instead of the P-type substrate, then the polarities are reversed, as is well known.

Although memory embodiments of the invention have been illustrated in connection with FIGS. 7 to 12, it should be understood that this invention can also be readily utilized in logic structures, e.g., in structures employing integrated injection logic techniques.

While the invention has been particularly shown and described with reference to preferred embodiments thereof, it will be understood by those skilled in the art that various changes in form and details may be made therein without departing from the spirit and scope of the invention.

What is claimed is:

1. A method of making a transistor structure in a semiconductor substrate of a given conductivity type having a major surface comprising the steps of:
isolating a region of said semiconductor substrate at said major surface,
forming a collector region of a conductivity type opposite to that of said given conductivity type below and spaced from said major surface so as to define a base region between said collector region and said major surface,
applying a first self-passivating conductive layer to a first portion of said major surface,
passing impurities of said given conductivity type to said first portion of said major surface through said first self-passivating conductive layer to form a contact region in said base region,
forming an insulating layer on the outer surface of said self-passivating conductive layer,
applying a second conductive layer to said insulating layer and to a second portion of said major surface adjacent to said first surface portion, and
passing impurities of said opposite conductivity type through said second conductive layer to said second surface portion adjacent said first surface portion to form within said base region an emitter region spaced within the thickness of said insulating layer from said first surface portion.

2. A method of making a transistor structure as set forth in claim 1 wherein said collector region is formed by implanting ions into said isolated region at increasing depths beginning from said major surface.

3. A method of making a transistor structure as set forth in claim 2 wherein ions are implanted across the entire isolated region of said semiconductor substrate through material disposed on said major surface providing various degrees of resistance to the flow of said ions.

4. A method of making a transistor structure as set forth in claim 3 wherein said ions are implanted through a plurality of materials.

5. A method of making a transistor structure as set forth in claim 4 wherein said ions are implanted through a plurality of materials including a layer of photoresist.

6. A method of making a transistor structure as set forth in claim 1 wherein said first self-passivating conductive layer applied to the first portion of said major surface is made of polysilicon.

7. A method of making a transistor structure as set forth in claim 1 wherein the first self-passivating conductive layer applied to said first portion of said major surface is made of aluminum, tantalum, zirconium or niobium.

8. A method of making a transistor structure as set forth in claim 1 wherein said first self-passivating conductive layer applied to the first portion of said major surface is made of a metallic silicide.

9. A method of making a transistor structure as set forth in claim 6 wherein said second conductive layer applied to said insulating layer and to said second portion is a self-passivating conductive layer.

10. A method of making a transistor structure as set forth in claim 9 wherein said second self-passivating layer applied to said insulating layer and to said second portion is made of polysilicon.

11. A method of making a transistor structure as set forth in claim 6 wherein said insulating layer formed on said polysilicon layer is a polysilicon oxide layer.

12. A method of making a transistor structure as set forth in claim 1 wherein said first self-passivating conductive layer is applied to said first portion of said major surface by:
applying an insulating medium to said isolated major surface of said semiconductor substrate,
applying a photoresist layer over said insulating medium,
etching an opening through said photoresist layer and said insulating medium to define said first portion of said major surface, and
applying said first self-passivating conductive layer to said first portion of said major surface through said opening.

13. A method of making a transistor structure as set forth in claim 12 further including the steps of removing the remaining portion of said photoresist layer and then forming said insulating layer by oxidizing the outer surface of said first self-passivating conductive layer.

14. A method of making a transistor structure as set forth in claim 13 wherein said first self-passivating conductive layer applied to the first portion of said major surface is made of polysilicon.

15. A method of making a transistor structure as set forth in claim 14 wherein the remainder of said insulating medium is removed from said isolated major surface of said semiconductor substrate and then said second conductive layer is applied over said insulating layer and said second protion of said major surface.

16. A method of making a transistor structure as set forth in claim 15 wherein said second conductive layer applied over said insulating layer and said second portion of said major surface is made of polysilicon.

17. A method of making a transistor structure as set forth in claim 16 further including the steps of:
forming a dielectric layer over said second conductive layer, and
applying a third conductive layer over said dielectric layer.

18. A method of making a transistor structure as set forth in claim 17 further including the step of providing electrical connections to said first and third conductive layers and to said collector region.

19. A method of making a transistor structure in a semiconductor substrate of a given conductivity type having a major surface comprising the steps of:
isolating a region of said semiconductor substrate at said major surface,
forming a collector region of a conductivity type opposite to that of said given conductivity type below and spaced from said major surface so as to define a base region between said collector region and said major surface,
applying a first self-passivating conductive layer to a plurality of selected first portions of said major surface,
passing impurities of said given conductivity type to said plurality of selected first portions of said major surface through said first self-passivating conductive layer to form a contact region in said base region,
forming an insulating layer on the outer surface of said self-passivating conductive layer,
applying a like plurality of segments of a second conductive layer to said insulating layer and to a like plurality of selected second portions of said major surface, each of said selected second portions being adjacent to one of said selected first portions of said major surface, and
passing impurities of said opposite conductivity type through said plurality of segments of said second conductive layer to said plurality of selected second portions of said major surface to form within said base region a like plurality of emitters, each being spaced within the thickness of said insulating layer from said first surface portions.

20. A method of making a transistor structure as set forth in claim 19 wherein said first self-passivating conductive layer applied to said major surface is made of polysilicon and said plurality of selected first portions of said major surface are interconnected.

21. A method of making a transistor structure as set forth in claim 19 wherein said first self-passivating conductive layer applied to said major surface is made of anodizable material.

22. A method of making a transistor structure as set forth in claim 19 wherein said first self-passivating conductive layer applied to said major surface is made of a metallic silicide.

23. A method of making a transistor structure as set forth in claim 20 wherein said second conductive layer applied to said insulating layer and to said plurality of selected second portions of said major surface is a self-passivating conductive layer.

24. A method of making a transistor structure as set forth in claim 23 wherein said second self-passivating layer applied to said insulating layer and to said plurality of selected second portions of said major surface is made of polysilicon.

25. A method of making a transistor structure as set forth in claim 20 wherein said insulating layer formed on said polysilicon layer is a polysilicon oxide layer.

26. A method of making a transistor structure as set forth in claim 25 further including the steps of:
forming a dielectric layer over each of said plurality of segments of said second conductive layer, and
applying a like plurality of segments of a third conductive layer over said dielectric layer in juxtaposition with respect to said plurality of segments of said second conductive layer, whereby a like plurality of capacitors are formed thereby.

27. A method of making a transistor structure as set forth in claim 26 further including the step of providing electrical connections to said first conductive layer, said plurality of segments of said third conductive layer and to said collector region.

28. A method of making a transistor structure as set forth in claim 19 wherein said insulating layer is formed by converting the outer portion of said self-passivating conductive layer into an insulating material.

* * * * *